US012742838B2

(12) United States Patent
Moriya et al.

(10) Patent No.: US 12,742,838 B2
(45) Date of Patent: Sep. 22, 2026

(54) OPTICALLY PUMPED MAGNETOMETER AND MAGNETOENCEPHALOGRAPH

(71) Applicants: HAMAMATSU PHOTONICS K.K., Hamamatsu (JP); Kyoto University, Kyoto (JP)

(72) Inventors: Takahiro Moriya, Hamamatsu (JP); Takenori Oida, Hamamatsu (JP); Akinori Saito, Hamamatsu (JP); Motohiro Suyama, Hamamatsu (JP); Yosuke Ito, Kyoto (JP); Hiroyuki Ueda, Kyoto (JP)

(73) Assignees: HAMAMATSU PHOTONICS K.K., Hamamatsu (JP); Kyoto University, Kyoto (JP)

( * ) Notice: Subject to any disclaimer, the term of this patent is extended or adjusted under 35 U.S.C. 154(b) by 164 days.

(21) Appl. No.: 18/773,654

(22) Filed: Jul. 16, 2024

(65) Prior Publication Data

US 2025/0076423 A1 Mar. 6, 2025

(30) Foreign Application Priority Data

Aug. 31, 2023 (JP) ................................ 2023-141414

(51) Int. Cl.

*G01R 33/26* (2006.01)
*G01R 33/00* (2006.01)
*G01R 33/032* (2006.01)

(52) U.S. Cl.

CPC ......... *G01R 33/26* (2013.01); *G01R 33/0017* (2013.01); *G01R 33/032* (2013.01)

(58) Field of Classification Search

CPC ... G01R 33/0017; G01R 33/032; G01R 33/26
See application file for complete search history.

(56) References Cited

U.S. PATENT DOCUMENTS

| | | | | |
|---|---|---|---|---|
| 10,288,701 | B2 * | 5/2019 | Kobayashi ............ | G01R 33/26 |
| 10,782,368 | B2 | 9/2020 | Bulatowicz et al. | |

(Continued)

OTHER PUBLICATIONS

Limes, M. E. et al., "Portable magnetometry for detection of biomagnetism in ambient environments," Jun. 2, 2020, pp. 1-10.

(Continued)

*Primary Examiner* — Gregory H Curran
(74) *Attorney, Agent, or Firm* — Faegre Drinker Biddle & Reath LLP

(57) ABSTRACT

An optically pumped magnetometer includes a cell, a pump light incidence unit causing pump light to be incident on a sensitivity region inside the cell in a first direction, a probe light incidence unit causing probe light for detecting change in electron spins to be incident on the sensitivity region in a direction intersecting the first direction, a bias magnetic field coil applying a bias magnetic field in the first direction to the inside of the cell and determining a resonance frequency of the electron spins, a gradient correction coil correcting a gradient of the bias magnetic field, an electron spin tilting unit tilting a rotation axis direction of the electron spins, an optical sensor detecting the probe light having passed through the sensitivity region, and a magnetic field measuring unit measuring a magnetic field strength related to the sensitivity region based on an output of the optical sensor.

9 Claims, 11 Drawing Sheets

(56) References Cited

U.S. PATENT DOCUMENTS

| | | | | |
|---|---|---|---|---|
| 11,105,865 | B2 * | 8/2021 | Kim | G01R 33/26 |
| 2021/0386347 | A1 * | 12/2021 | Moriya | A61B 5/245 |
| 2022/0091200 | A1 | 3/2022 | Gerginov | |

OTHER PUBLICATIONS

Lucivero, V. G. et al., “Femtotesla nearly quantum-noise-limited pulsed gradiometer at Earth-scale fields,” Dec. 17, 2021, pp. 1-5.

* cited by examiner 45a 45b 45c 45d
43a 43b 43c 43d
44a 44b 44c 44d
42a 42b 42c 42d
41a 41b 41c 41d
ARa ARb ARc ARd
Bm
Rf
2
QLa QLb QLc QLd
34a 34b 34c 34d
7
5
31a 32a 31b 32b 31c 32c 33

TH1
10
5
0
-5
-10
VOLTAGE [V]
0
1
2
3
TIME [ms]

TH
10
5
0
-5
-10
VOLTAGE [V]
0
1
2
3
TIME [ms]

1A
11
12
13
14
33
32c
31c
32b
32a
31b
31a
Bm
7
35
5
34d
34c
37
QLd
2
QLc
3
PL
34b
34a
QLb
QLa
21
22
4
6
43d
43c
43b
43a
27a
23a
9
By
Rf
x
y
z

OPTICALLY PUMPED MAGNETOMETER AND MAGNETOENCEPHALOGRAPH

TECHNICAL FIELD

The present disclosure relates to an optically pumped magnetometer and a magnetoencephalograph including the same.

BACKGROUND

An optically pumped magnetometer capable of measuring a weak external magnetic field is known (for example, refer to United States Patent Application, Publication No. 2022/0091200 and U.S. Pat. No. 10,782,368). In the optically pumped magnetometer, alkali metal atoms inside a cell are pumped by pump light, probe light radiated toward the cell in a manner of intersecting the pump light is measured by an optical sensor, and a strength of an external magnetic field is detected based on an output of the optical sensor.

SUMMARY

As such optically pumped magnetometers described above have become increasingly widespread in recent years, for example, it is required to increase a sensitivity of a magnetic field strength to be measured. Hence, the present disclosure aims to provide an optically pumped magnetometer and a magnetoencephalograph capable of enhancing a sensitivity of a magnetic field strength.

An optically pumped magnetometer according to an aspect of the present disclosure is, [1] "an optically pumped magnetometer including a cell configured to be filled with alkali metal vapor, a pump light incidence unit configured to cause pump light for pumping alkali metal atoms constituting the alkali metal vapor to be incident on a sensitivity region inside the cell in a first direction, a probe light incidence unit configured to cause probe light for detecting change in electron spins in a pumped state of the alkali metal atoms to be incident on the sensitivity region in a direction intersecting the first direction, a bias magnetic field coil configured to apply a bias magnetic field in the first direction to the inside of the cell and determine a resonance frequency of the electron spins, a gradient correction coil configured to correct a gradient of the bias magnetic field applied through the bias magnetic field coil, an electron spin tilting unit configured to tilt a rotation axis direction of the electron spins in a direction perpendicular to the first direction, an optical sensor configured to detect the probe light having passed through the sensitivity region, and a magnetic field measuring unit configured to measure a magnetic field strength related to the sensitivity region based on an output of the optical sensor".

In the optically pumped magnetometer, uniformity of a bias magnetic field can be enhanced and unevenness in resonance frequency of electron spins can be curbed by correcting the gradient of the bias magnetic field through the gradient correction coil. Accordingly, the sensitivity of a magnetic field strength can be enhanced.

The optically pumped magnetometer according to the aspect of the present disclosure may be, [2] "the optically pumped magnetometer according to the foregoing [1] in which the gradient correction coil includes a pair of first coils disposed on one side and the other side of the cell in the first direction and correcting an amount of change in the bias magnetic field with respect to an amount of change in position in the first direction". In this case, the uniformity of a bias magnetic field at the position in the first direction can be enhanced.

The optically pumped magnetometer according to the aspect of the present disclosure may be, [3] "the optically pumped magnetometer according to the foregoing [1] or [2] in which the gradient correction coil includes a pair of second coils disposed on one side and the other side of the cell in a second direction perpendicular to the first direction and correcting an amount of change in the bias magnetic field with respect to an amount of change in position in the second direction". In this case, the uniformity of a bias magnetic field at the position in the second direction can be enhanced.

The optically pumped magnetometer according to the aspect of the present disclosure may be, [4] "the optically pumped magnetometer according to any one of the foregoing [1] to [3] in which the gradient correction coil includes a pair of third coils disposed on one side and the other side of the cell in the first direction and correcting an amount of change in the bias magnetic field with respect to an amount of change in position in a third direction perpendicular to the first direction". In this case, the uniformity of a bias magnetic field at the position in the third direction can be enhanced.

The optically pumped magnetometer according to the aspect of the present disclosure may be, [5] "the optically pumped magnetometer according to any one of the foregoing [1] to [4] in which the gradient correction coil corrects the gradient of the bias magnetic field such that a relaxation time of free induction decay obtained from an output of the optical sensor becomes longer than a first time when correction by the gradient correction coil is not performed". In this case, the gradient of a bias magnetic field can be effectively corrected.

The optically pumped magnetometer according to the aspect of the present disclosure may be, [6] "the optically pumped magnetometer according to the foregoing [5] in which the gradient correction coil corrects the gradient of the bias magnetic field such that the relaxation time of free induction decay obtained from an output of the optical sensor becomes the longest". In this case, the gradient of a bias magnetic field can be more effectively corrected.

The optically pumped magnetometer according to the aspect of the present disclosure may be, [7] "the optically pumped magnetometer according to any one of the foregoing [1] to [4] in which the gradient correction coil corrects the gradient of the bias magnetic field such that a spectral peak after fast Fourier transform regarding a relaxation time of free induction decay obtained from an output of the optical sensor becomes steeper than when correction by the gradient correction coil is not performed". In this case, the gradient of a bias magnetic field can be effectively corrected.

The optically pumped magnetometer according to the aspect of the present disclosure may be, [8] "the optically pumped magnetometer according to the foregoing [7] in which the gradient correction coil corrects the gradient of the bias magnetic field such that the spectral peak after fast Fourier transform regarding the relaxation time of free induction decay obtained from an output of the optical sensor becomes the steepest". In this case, the gradient of a bias magnetic field can be more effectively corrected.

The optically pumped magnetometer according to the aspect of the present disclosure may be, [9] "the optically pumped magnetometer according to any one of the foregoing [1] to [8] further including one or a plurality of mirrors configured to reflect the probe light traveling inside the cell toward the outside of the cell or having traveled from the inside of the cell to the outside of the cell such that the probe light returns to the inside of the cell". In this case, an optical path length of probe light inside the cell can be increased, and a level of noise caused by probe light can be reduced, for example.

The optically pumped magnetometer according to the aspect of the present disclosure may be, [10] "the optically pumped magnetometer according to any one of the foregoing [1] to [9] in which the electron spin tilting unit radiates an RF signal having the same frequency as the resonance frequency". In this case, the rotation axis direction of electron spins can be tilted utilizing an RF signal.

The optically pumped magnetometer according to the aspect of the present disclosure may be, [11] "the optically pumped magnetometer according to any one of the foregoing [1] to [9] in which the electron spin tilting unit radiates pulsed light". In this case, the rotation axis direction of electron spins can be tilted utilizing pulsed light.

The optically pumped magnetometer according to the aspect of the present disclosure may be, [12] "the optically pumped magnetometer according to any one of the foregoing [1] to [11] in which there are two or more of the sensitivity regions, and the magnetic field measuring unit measures the magnetic field strength based on a difference between outputs of the optical sensor corresponding to the two adjacent sensitivity regions". In this case, common mode noise which is common to two sensitivity regions is removed so that measurement of a weak magnetic field strength can be realized.

A magnetoencephalograph according to another aspect of the present disclosure is, [13] "a magnetoencephalograph including the optically pumped magnetometer according to any one of the foregoing [1] to [12] configured to be provided in a manner of being able to be disposed around the head of a test object and measure a strength of a magnetic field emitted from the test object".

Since this magnetoencephalograph is also provided with the foregoing optically pumped magnetometer, the foregoing operational effect of being able to enhance a sensitivity of a magnetic field strength is exhibited.

DETAILED DESCRIPTION

Hereinafter, an embodiment of the present invention will be described in detail with reference to the accompanying drawings. In description, the same reference signs are used for the same elements or elements having the same function, and duplicate description thereof will be omitted.

Figure 1:
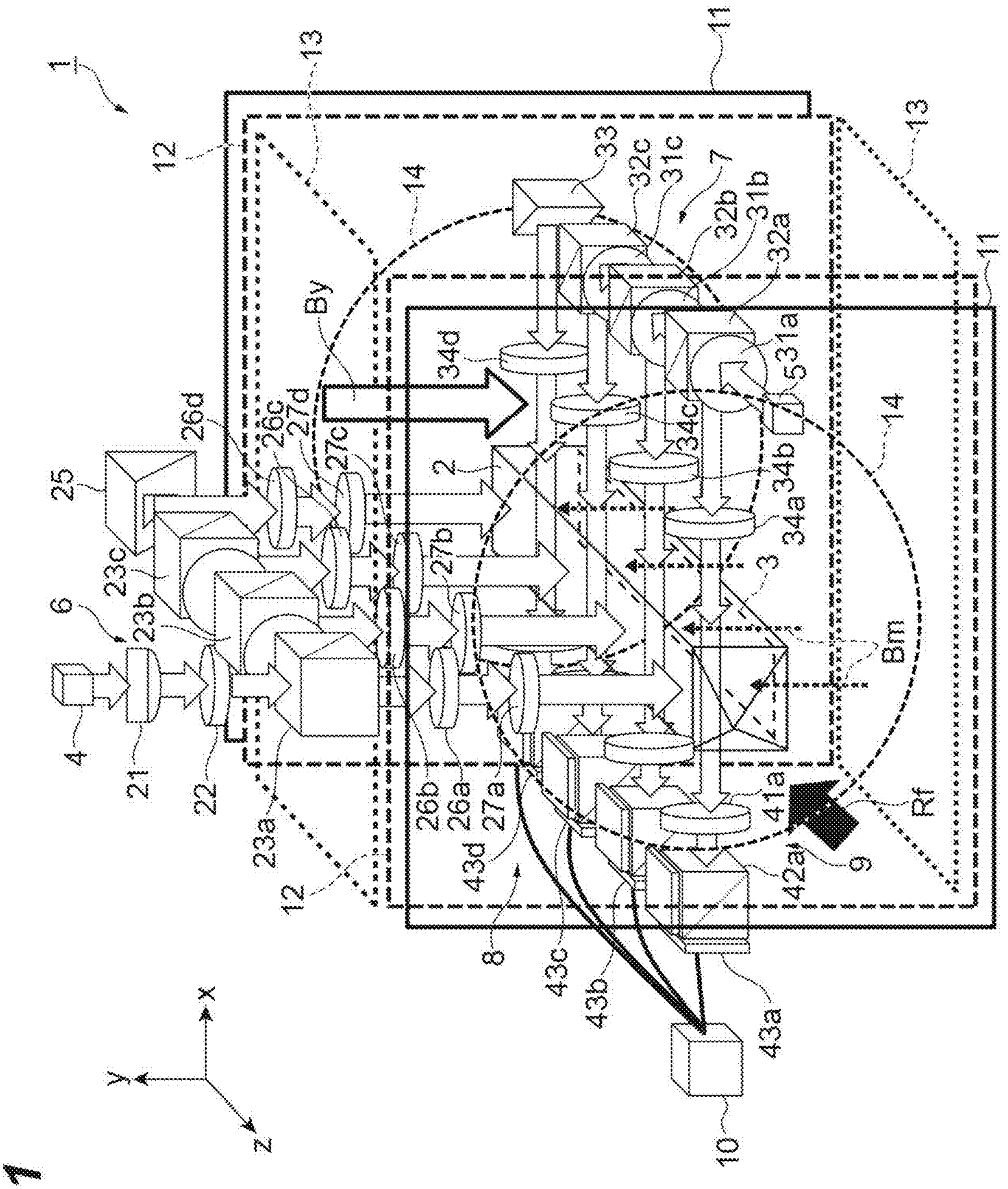
FIG. 1 is a perspective view illustrating a constitution of an optically pumped magnetometer according to an embodiment.

FIG. 1 is a perspective view illustrating a constitution of an optically pumped magnetometer 1 according to the embodiment. The optically pumped magnetometer 1 is a device for measuring an external magnetic field utilizing optical pumping. In the present embodiment, the optically pumped magnetometer 1 will be described as being used for magnetoencephalographic measurement, but the usage is not limited thereto. As an example, a measurement target of the optically pumped magnetometer 1 is a cerebral magnetic field. For the sake of description, in FIG. 1, a direction lying in a magnetic field direction of a measurement target is a y axis. Two axes perpendicular to the y axis, which are axes constituting a three-dimensional coordinate system together with the y axis and perpendicular to each other, are an x axis and a z axis, respectively. As will be described below, a direction along the x axis corresponds to an incidence direction of probe light in a sensitivity region, and a direction along the y axis corresponds to an incidence direction of pump light in the sensitivity region. In the following description, a positive direction and a negative direction along the x axis will be respectively expressed as a positive x axis direction and a negative x axis direction, a positive direction and a negative direction along the y axis will be respectively expressed as a positive y axis direction and a negative y axis direction, and a positive direction and a negative direction along the z axis will be respectively expressed as a positive z axis direction and a negative z axis direction. The y axis direction corresponds to a first direction, the z axis direction corresponds to a second direction, and the x axis direction corresponds to a third direction.

As illustrated in FIG. 1, the optically pumped magnetometer 1 includes a cell 2, a heater 3, a pump laser 4, a probe laser 5, a first optical system 6, a second optical system 7, an optical sensor group 8, a third optical system 9, a read circuit 10, a bias magnetic field coil 11, bias magnetic field gradient correction coils 12 and 13, and a tilting coil (electron spin tilting unit) 14. The optically pumped magnetometer 1 is an orthogonal sensor. Hereinafter, constitution elements of the optically pumped magnetometer 1 will be described in detail.

The cell 2 is a container to be filled with alkali metal vapor. The cell 2 is disposed in the z axis direction. The cell 2 substantially has a rectangular parallelepiped bottomed tubular shape with a surface substantially parallel to an xz plane. A cross section of the cell 2 in a direction perpendicular to a longitudinal direction of the cell 2 (a direction along an xy plane) has a square shape, for example. The cell 2 may be constituted using a material such as quartz, sapphire, silicon, Kovar glass, or borosilicate glass, for example. The cell 2 allows light transmission with respect to pump light and probe light, which will be described below. The heater 3 and the like are attached to a side surface of the cell 2 in the negative y axis direction. A magnetic field Bm of a measurement target generated from the measurement target is incident in the positive y axis direction on the side surface of the cell 2 in the negative y axis direction.

An alkali metal constituting alkali metal vapor filling the cell 2 may be, for example, at least one or more kinds from lithium (Li), sodium (Na), potassium (K), rubidium (Rb), and cesium (Cs). For example, the alkali metal may be potassium and rubidium or may simply be potassium. Potassium has a comparatively low spin-destruction collision relaxation rate among the kinds of alkali metal used in an optically pumped magnetometer. For example, the spin-destruction collision relaxation rate of potassium is lower than those of cesium, rubidium, and the like. Therefore, when a single alkali metal is employed, an optically pumped magnetometer simply using potassium has a higher sensitivity than an optically pumped magnetometer simply using cesium or simply using rubidium.

In addition, the cell 2 accommodates a filler gas. The filler gas curbs relaxation of spin polarization of alkali metal vapor. In addition, the filler gas protects alkali metal vapor and curbs noise light emission. For example, the filler gas may be an inert gas such as helium (He), neon (Ne), argon (Ar), krypton (Kr), xenon (Xe), or nitrogen (N2). For example, the filler gas may be helium and nitrogen.

As described above, the heater 3 is attached to the cell 2. The heater 3 generates heat in response to a current supplied from a heater power source (not illustrated). The heater 3 controls the vapor density of alkali metal by controlling the internal temperature of the cell 2. For example, when potassium is accommodated in the cell 2 as an alkali metal, the heater 3 heats the cell 2 such that the internal temperature thereof becomes 120° C.

The pump laser 4 emits pump light for pumping alkali metal atoms in the negative y axis direction. That is, the pump laser 4 emits pump light (linear polarized light) and converts it into circularly polarized light through ¼ wavelength plates 27*a* to 27*d*. The alkali metal atoms accommodated in the cell 2 are pumped by pump light in a polarized state (circularly polarized light), and spin polarization occurs. The wavelength of pump light is set depending on the kind of atoms constituting alkali metal vapor (more specifically, the wavelength of an absorption line). For example, when atoms constituting alkali metal vapor are potassium, the wavelength of pump light is set to 770.11 nm matching the resonance line of potassium. When the alkali metal atoms accommodated in the cell 2 are potassium and rubidium, the pump laser 4 may emit pump light for transferring spin polarization of atoms of the rubidium to atoms of the potassium by pumping atoms of the rubidium. In this case, atoms of the rubidium are in a pumped state by the pump light. Further, spin polarization of atoms of the rubidium is transferred to atoms of the potassium due to spin exchange interaction between the potassium and the rubidium, and thus atoms of the potassium are in a pumped state.

Figure 2:
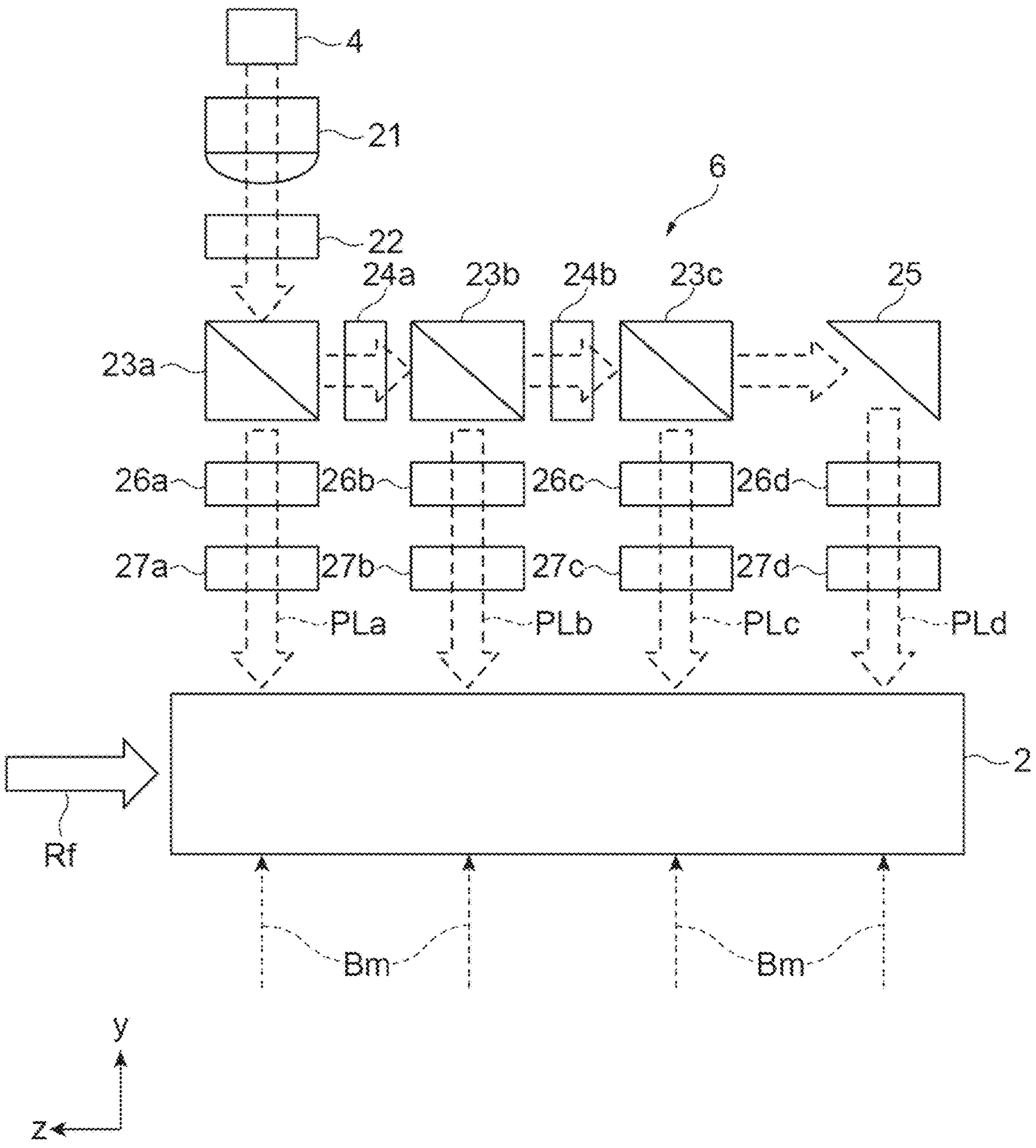
FIG. 2 is a plan view of a first optical system in FIG. 1 viewed in a negative x axis direction.

Pump light from the pump laser 4 is incident on the cell 2 via the first optical system 6. FIG. 2 is a plan view of the first optical system 6 viewed in the negative x axis direction. The first optical system 6 is constituted to include a lens 21, a ½ wavelength plate 22, polarization beam splitters 23*a*, 23*b*, and 23*c*, ½ wavelength plates 24*a* and 24*b*, a total reflection mirror 25, polarizers 26*a*, 26*b*, 26*c*, and 26*d*, and the ¼ wavelength plates 27*a*, 27*b*, 27*c*, and 27*d*.

The lens 21 is provided adjacent to the pump laser 4 in the negative y axis direction and condenses pump light emitted from the pump laser 4. The ½ wavelength plate 22 is provided adjacent to the lens 21 in the negative y axis direction and rotates a polarization plane such that power of the pump laser 4 is distributed by 1:3 through the polarization beam splitter 23*a*.

The polarization beam splitter 23*a* is provided adjacent to the ½ wavelength plate 22 in the negative y axis direction and separates components of two rays of linear polarized light perpendicular to each other from a polarization component of pump light which has been transmitted through the ½ wavelength plate 22. The component of one ray of linear polarized light is transmitted therethrough in the negative y axis direction, and the component of the other ray of linear polarized light is reflected in the negative z axis direction. The polarization beam splitters 23*b* and 23*c* and the total reflection mirror 25 are provided side by side in order in the negative z axis direction with respect to the polarization beam splitter 23*a*. Each of the polarization beam splitters 23*b* and 23*c* separates the components of two rays of linear polarized light perpendicular to each other from pump light which has been transmitted through the polarization beam splitters 23*a* and 23*b*. The component of one ray of linear polarized light is transmitted therethrough in the negative z axis direction, and the component of the other ray of linear polarized light is reflected in the negative y axis direction. The total reflection mirror 25 reflects pump light (linear polarized light) which has been transmitted through the polarization beam splitter 23*c* in the negative y axis direction.

The ½ wavelength plate 24*a* is provided between the polarization beam splitter 23*a* and the polarization beam splitter 23*b* and rotates the polarization plane of pump light (linear polarized light) reflected by the polarization beam splitter 23*a*. Accordingly, the pump light can be separated into polarization components of two rays of linear polarized light by the polarization beam splitter 23*b*. The ½ wavelength plate 24*b* is provided between the polarization beam splitter 23*b* and the polarization beam splitter 23*c* and rotates the polarization plane of pump light (linear polarized light) which has been transmitted through the polarization beam splitter 23*b*. Accordingly, pump light can be separated into polarization components of two rays of linear polarized light by the polarization beam splitter 23*c*.

The polarizer 26*a* and the ¼ wavelength plate 27*a* are provided adjacent to the polarization beam splitter 23*a* in order in the negative y axis direction. The polarizer 26*a* allows the component of particular linear polarized light of the pump light which has been transmitted through the polarization beam splitter 23*a* to be transmitted therethrough, and the ¼ wavelength plate 27*a* changes the polarized state of the pump light which has been transmitted through the polarizer 26*a* to that of circularly polarized light and allows it to be transmitted therethrough in the negative y axis direction as pump light PLa.

The polarizers 26*b*, 26*c*, and 26*d* and the ¼ wavelength plates 27*b*, 27*c*, and 27*d* are provided respectively adjacent to the polarization beam splitters 23*b* and 23*c* and the total reflection mirror 25 in order in the negative y axis direction. The polarizers 26*b*, 26*c*, and 26*d* and the ¼ wavelength plates 27*b*, 27*c*, and 27*d* have the same functions as the polarizer 26*a* and the ¼ wavelength plate 27*a* respectively and allow rays of pump light PLb, PLc, and PLd to be transmitted therethrough in the negative y axis direction.

The first optical system 6 having the foregoing constitution is constituted such that rays of the pump light PLa to PLd of four systems transmitted through the four ¼ wavelength plates 27*a*, 27*b*, 27*c*, and 27*d* can be respectively incident on sensitivity regions ARa to ARd inside the cell 2. The pump laser 4 and the first optical system 6 constitute a pump light incidence unit causing rays of the pump light PLa to PLd to be incident on the sensitivity regions ARa to ARd in the negative y axis direction.

The probe laser 5 emits probe light for detecting precession of spins when electron spins in a pumped state of alkali metal atoms are laid 90 degrees. That is, the probe laser 5 emits probe light (linear polarized light). When passing through alkali metal vapor, probe light is influenced by the state of spin polarization of alkali metal atoms so that the polarization angle changes. The state of precession of spins can be derived upon detection of this change in polarization angle. The wavelength of probe light is set depending on the kind of atoms constituting alkali metal vapor (more specifically, the wavelength of an absorption line). For example, when simply potassium is accommodated in the cell 2 as an alkali metal, the wavelength of probe light is detuned from the wavelength of pump light (for example, 770.11 nm). For example, it is approximately 770.05 nm. Since the wavelength of probe light is detuned from the wavelength of pump light, absorption of probe light by potassium is curbed.

When potassium and rubidium are accommodated in the cell 2 as alkali metals, the probe laser 5 may emit probe light for detecting change in polarization angle caused by spin polarization in a pumped state of atoms of potassium. The density of rubidium used for pumping is set to be smaller than the density of potassium used for probing. When the density of rubidium is smaller than the density of potassium, decay of pump light due to pumping is curbed. Accordingly, the optically pumped magnetometer 1 can achieve a uniform sensitivity inside the cell 2.

Figure 3:
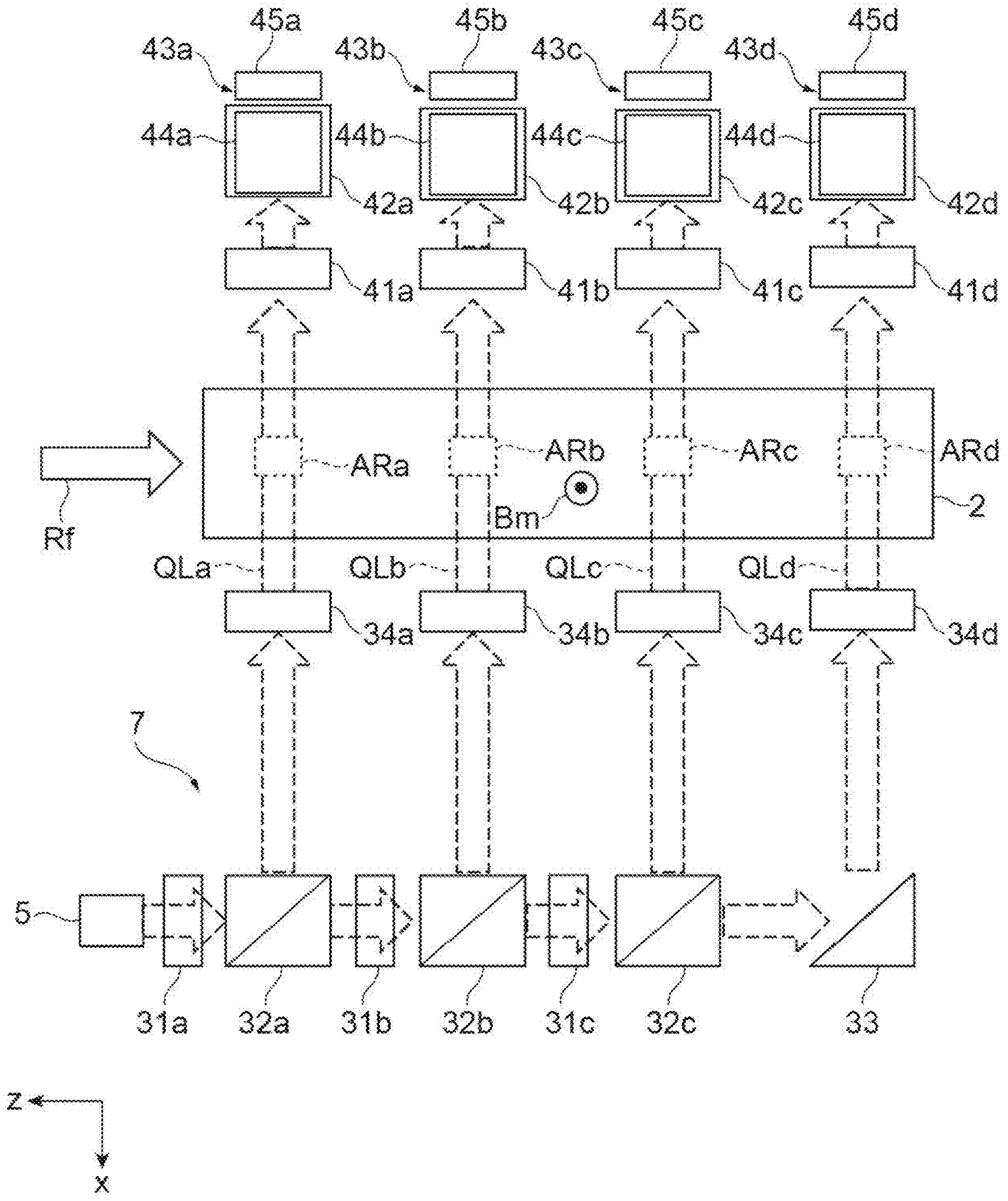
FIG. 3 is a plan view of a second optical system, an optical sensor group, and a third optical system in FIG. 1 viewed in a negative y axis direction.

Probe light from the probe laser 5 is incident on the cell 2 via the second optical system 7. FIG. 3 is a plan view of the second optical system 7, the optical sensor group 8, and the third optical system 9 viewed in the negative y axis direction. The second optical system 7 is constituted to include ½ wavelength plates 31*a*, 31*b*, and 31*c*, polarization beam splitters 32*a*, 32*b*, and 32*c*, a total reflection mirror 33, and polarizers 34*a*, 34*b*, 34*c*, and 34*d*.

The ½ wavelength plate 31*a* is provided adjacent to the probe laser 5 in the negative z axis direction and rotates the polarization plane such that power of the probe laser 5 is distributed by 1:3 through the polarization beam splitter 32*a*. The polarization beam splitters 32*a*, 32*b*, and 32*c* are provided side by side in order in the negative z axis direction with respect to the ½ wavelength plate 31*a* and separate components of two rays of linear polarized light perpendicular to each other from a polarization component of probe light which has been transmitted through the ½ wavelength plate 31*a*. The component of one ray of linear polarized light is transmitted therethrough in the negative z axis direction, and the component of the other ray of linear polarized light is reflected in the negative x axis direction. The ½ wavelength plate 31*b* is provided between the polarization beam splitter 32*a* and the polarization beam splitter 32*b* and rotates the polarization plane of probe light (linear polarized light) which has been transmitted through the polarization beam splitter 32*a*. Accordingly, probe light can be separated into polarization components of two rays of linear polarized light through the polarization beam splitter 32*b*. The ½ wavelength plate 31*c* is provided between the polarization beam splitter 32*b* and the polarization beam splitter 32*c* and rotates the polarization plane of probe light (linear polarized light) which has been transmitted through the polarization beam splitter 32*b*. Accordingly, probe light can be separated into polarization components of two rays of linear polarized light through the polarization beam splitter 32*c*. The total reflection mirror 33 reflects probe light (linear polarized light) which has been transmitted through the polarization beam splitter 32*c* in the negative x axis direction.

Each of the polarizers 34*a*, 34*b*, 34*c*, and 34*d* allows the component of particular linear polarized light of the probe light reflected by the polarization beam splitters 32*a*, 32*b*, and 32*c* and the total reflection mirror 33 to be transmitted therethrough.

The second optical system 7 having the foregoing constitution is constituted such that rays of probe light QLa to QLd of four systems transmitted through the four polarizers 34*a*, 34*b*, 34*c*, and 34*d* can be respectively incident on the sensitivity regions ARa to ARd inside the cell 2. The sensitivity regions ARa to ARd are regions arranged away from each other in the longitudinal direction (z axis direction) inside the cell 2. The sensitivity regions ARa to ARd are regions intersecting rays of the pump light PLa to PLd inside the cell 2. The sensitivity regions ARa to ARd are intersection regions where rays of the probe light QLa to QLd and rays of the pump light PLa to PLd intersect each other. The probe laser 5 and the second optical system 7 constitute a probe light incidence unit causing rays of the probe light QLa to QLd to be incident on the sensitivity regions ARa to ARd in the x axis direction.

With reference to FIG. 1, the bias magnetic field coil 11 is a coil applying a bias magnetic field By to the inside of the cell 2 in the y axis direction and determines a resonance frequency of electron spins of alkali metal atoms pumped inside the cell 2. The bias magnetic field coil 11 applies the bias magnetic field By in the same direction as the incidence direction of pump light with respect to the sensitivity regions ARa to ARd to the inside of the cell 2. Accordingly, the rotation axes of electron spins of alkali metal atoms pumped inside the cell 2 are aligned in the y axis direction. When a magnetic field strength of a bias magnetic field applied through the bias magnetic field coil 11 is 14 μT and alkali metal atoms are potassium, the resonance frequency of electron spins becomes 100 kHz. 14 μT is a magnetic field strength which can be easily formed.

The bias magnetic field gradient correction coils 12 and 13 are in a coil group for correcting the gradient in the x axis direction, the y axis direction, and the z axis direction in the bias magnetic field By. The bias magnetic field gradient correction coils 12 and 13 may be constituted to correct the gradient in one direction or two directions of the x axis direction, the y axis direction, and the z axis direction in the bias magnetic field By or may be constituted to correct the gradient in three directions. Due to the presence of the bias magnetic field gradient correction coils 12 and 13, even when the bias magnetic field By is not uniform due to an influence of an environmental magnetic field or the like, correction can be performed such that it becomes uniform, and a detection sensitivity of the optically pumped magnetometer 1 with respect to an external magnetic field can be enhanced.

The tilting coil 14 generates and radiates an RF signal Rf in order to tilt the rotation axis direction of electron spins of alkali metal atoms pumped inside the cell 2 in a direction perpendicular to the incidence direction of pump light. Specifically, the tilting coil 14 generates the RF signal Rf having the same frequency as the resonance frequency of electron spins (100 kHz when the strength of the bias magnetic field By is 14 μT and alkali metal atoms are potassium) and radiates the RF signal Rf in the negative z axis direction with a strength and a length required for electron spins to tilt by 90°. In place of the tilting coil 14, a means for radiating different pulsed pump light in a direction orthogonal to the incidence direction of pump light may be provided as an electron spin tilting unit for tilting the direction of electron spins.

Returning to FIG. 3, constitutions of the optical sensor group 8 and the third optical system 9 will be described.

The third optical system 9 is constituted to include ½ wavelength plates 41*a*, 41*b*, 41*c*, and 41*d*, and polarization beam splitters 42*a*, 42*b*, 42*c*, and 42*d*. The ½ wavelength plates 41*a*, 41*b*, 41*c*, and 41*d* are provided adjacent to the cell 2 in the negative x axis direction on optical paths of rays of the probe light QLa, QLb, QLc, and QLd which have respectively passed through the sensitivity regions ARa to ARd of the cell 2 and rotate the polarization plane of linear polarized light of rays of the probe light QLa, QLb, QLc, and QLd which have passed through the cell 2. These ½ wavelength plates 41*a*, 41*b*, 41*c*, and 41*d* are supported in a manner of being able to rotate about the axis along the x axis such that the rotation angle of the polarization plane of probe light can be adjusted. Each of the polarization beam splitters 42*a*, 42*b*, 42*c*, and 42*d* separates the components of two rays of linear polarized light perpendicular to each other from the polarization components of rays of the probe light QLa, QLb, QLc, and QLd which have been transmitted through the ½ wavelength plates 41*a*, 41*b*, 41*c*, and 41*d*. The component of one ray of linear polarized light is transmitted therethrough in the negative x axis direction, and the component of the other ray of linear polarized light is reflected in the y axis direction.

The optical sensor group 8 is an element group for detecting polarization plane angles of rays of the probe light QLa, QLb, QLc, and QLd which have passed through the sensitivity regions ARa to ARd and is constituted to include four optical sensor pairs (optical sensors) 43*a*, 43*b*, 43*c*, and 43*d*. The optical sensor pair 43*a* has two photodiodes 44*a* and 45*a*. The photodiode 44*a* outputs a detection signal indicating the detected strength of the component of the other ray of linear polarized light of the probe light QLa, and the photodiode 45*a* outputs a detection signal indicating the detected strength of the component of one ray of linear polarized light of the probe light QLa. Similarly, the optical sensor pairs 43*b*, 43*c*, and 43*d* respectively have two photodiodes 44*b* and 45*b*, two photodiodes 44*c* and 45*c*, and two photodiodes 44*d* and 45*d*. The two photodiodes 44*b* and 45*b* respectively output detection signals indicating detection of strengths of the components of two rays of linear polarized light of the probe light QLb, the two photodiodes 44*c* and 45*c* respectively output detection signals indicating detection of strengths of the components of two rays of linear polarized light of the probe light QLc, and the two photodiodes 44*d* and 45*d* respectively output detection signals indicating detection of the components of two rays of linear polarized light of the probe light QLd.

With reference to FIG. 1 again, the read circuit 10 is a processing circuit which is electrically connected to the four optical sensor pairs 43*a*, 43*b*, 43*c*, and 43*d* constituting the optical sensor group 8 and performs processing of detection signals output from the four optical sensor pairs 43*a*, 43*b*, 43*c*, and 43*d*. That is, the read circuit 10 includes a reading unit for reading detection signals (outputs of the optical sensor pair 43*a*, 43*b*, 43*c*, and 43*d*) output from the four optical sensor pairs 43*a*, 43*b*, 43*c*, and 43*d*, and a measuring unit for executing processing of measuring external magnetic fields related to the sensitivity regions ARa to ARd based on the detection signals. However, the measuring unit may be constituted to be provided outside the optically pumped magnetometer 1 and execute measurement processing based on a detection signal output from the optically pumped magnetometer 1. The read circuit 10 constitutes a magnetic field measuring unit.

The read circuit 10 is constituted to physically include a memory such as a RAM and a ROM, a processor (arithmetic circuit) such as a CPU, a communication interface, and an auxiliary memory device such as a hard disk and a semiconductor memory. For example, the read circuit 10 may be realized by a personal computer, a cloud server, a smartphone, a tablet terminal, or the like. Functions of the read circuit 10 are realized by the CPU of a computer system executing a program stored in the memory.

Figure 4A:
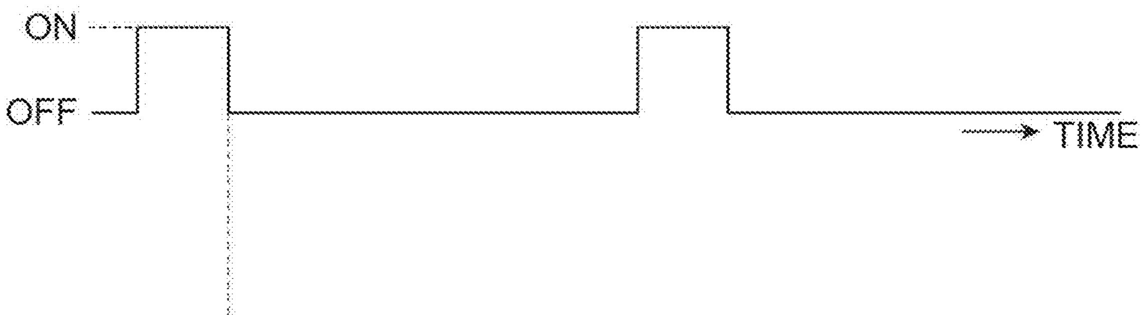
FIG. 4A is a timing chart showing a generation timing of pump light during processing of measuring an external magnetic field by a read circuit in FIG. 1.
Figure 4B:
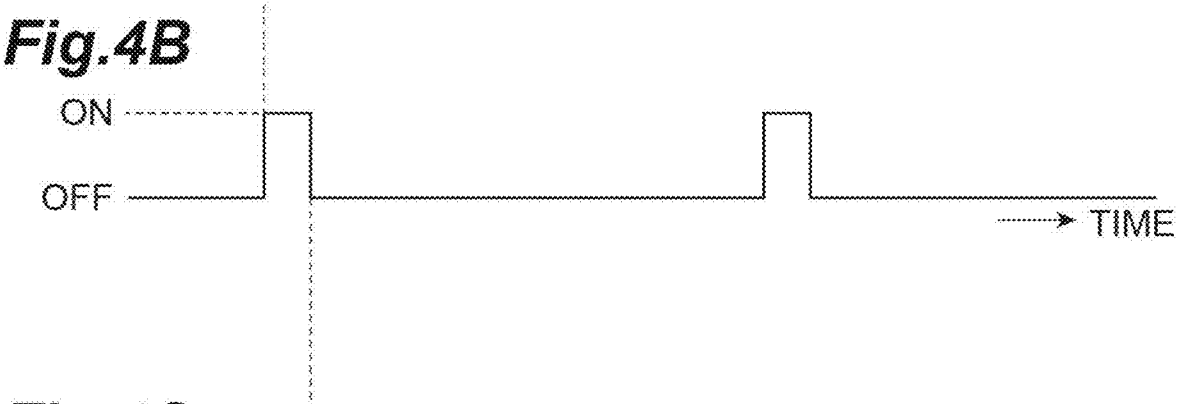
FIG. 4B is a timing chart showing an RF signal during processing of measuring an external magnetic field by the read circuit in FIG. 1.
Figure 4C:
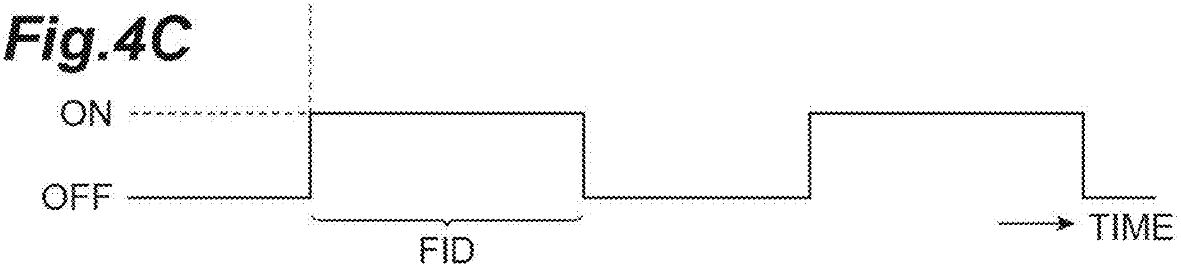
FIG. 4C is a timing chart showing a generation timing of probe light during processing of measuring an external magnetic field by the read circuit in FIG. 1.
Figure 5:
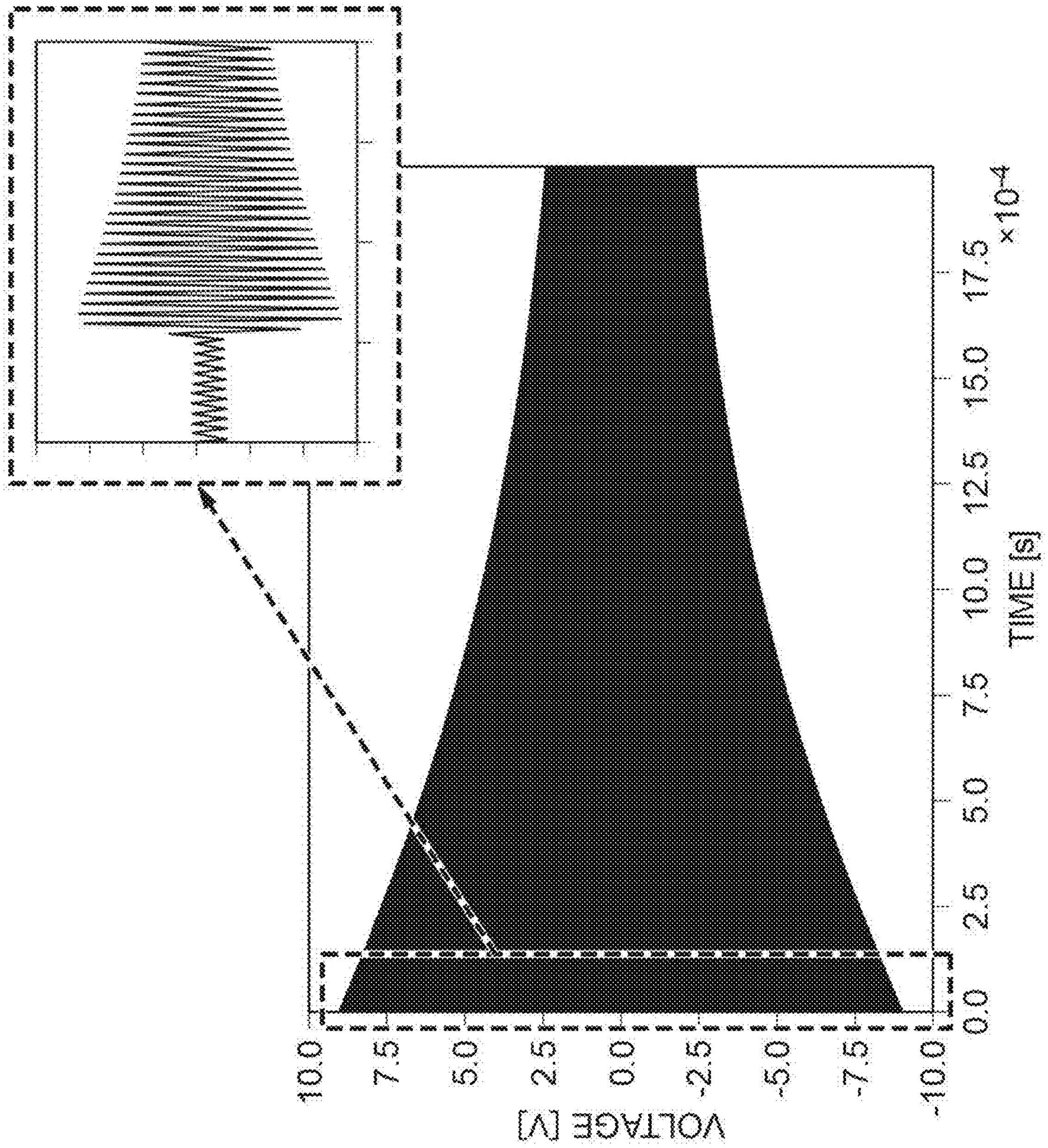
FIG. 5 is a graph showing change over time in FID acquired by the read circuit in FIG. 1.

Functions of processing of measuring an external magnetic field by the measuring unit of the read circuit 10 will be described with reference to FIGS. 4A, 4B, 4C, and 5. FIG. 4A shows a generation timing of pump light during processing of measuring an external magnetic field by the read circuit 10, FIG. 4B shows a generation timing of an RF signal during processing of measuring an external magnetic field by the read circuit 10, and FIG. 4C shows a reading timing of probe light during processing of measuring an external magnetic field by the read circuit 10. FIG. 5 is a graph showing change over time in free induction decay (FID) acquired by the read circuit 10.

During processing of measuring an external magnetic field by the read circuit 10, pump light is radiated by a control circuit (not illustrated) such that ON and OFF are repeated in a pulsed shape (refer to FIG. 4A), an RF signal is radiated in a pulsed shape immediately after the pump light has shifted from ON to OFF (refer to FIG. 4B), and control is performed such that probe light is read during a predetermined relaxation time after radiation of the RF signal (refer to FIG. 4C). In such a control state, the read circuit 10 acquires detection signals output from the four optical sensor pairs 43*a*, 43*b*, 43*c*, and 43*d* during the relaxation time. Further, the read circuit 10 acquires the FID by taking a difference between the detection signals of the two photodiodes 44*a* and 45*a* constituting the optical sensor pair 43*a* (refer to FIG. 5). Similarly, regarding the optical sensor pairs 43*b*, 43*c*, and 43*d* as well, the read circuit 10 acquires change over time in FID by taking a difference between the detection signals of the two photodiodes.

The foregoing FID indicates a situation of relaxation of electron spins of alkali metal atoms, and the frequency of precession of electron spins changes in accordance with fluctuation in external magnetic field in the sensitivity region ARa so that the frequency of oscillation changes due to fluctuation in external magnetic field. For example, if the external magnetic field changes from 0 pT to 1 pT while the resonance frequency of electron spins is 100 kHz, the frequency of precession changes by approximately 0.007 Hz. The read circuit 10 derives a frequency $a_1$ of oscillation of the FID utilizing such characteristics by performing fitting using a function V as shown in the following expression with respect to the waveform of the FID in the initial stage of the relaxation time, and acquires this frequency $a_1$ as a measurement value of the external magnetic field in the sensitivity region ARa.

$$V = a_0 \sin(2\pi a_1(t - a_2))e^{-a_3 t}$$ [Math. 1]

(in the foregoing expression, t indicates time and $a_0$, $a_1$, and $a_2$ indicate predetermined parameters)

Similarly, the read circuit 10 acquires the measurement value of the external magnetic field in the sensitivity regions ARb, ARc, and ARd based on the detection signals output from the optical sensor pairs 43*b*, 43*c*, and 43*d*. Moreover, the read circuit 10 can acquire time series data of measurement values by repeating this operation at a frequency of 100 to 1,000 Hz.

In the optically pumped magnetometer 1 described above, electron spins of alkali metal atoms are generated (pumped) by emitting pump light to the cell 2 filled with alkali metal vapor. The rays of the probe light QLa to QLd are emitted to the sensitivity regions ARa to ARd inside the cell 2, and the polarization plane angles of rays of the probe light QLa to QLd which have passed through the sensitivity regions ARa to ARd are detected by the optical sensor pairs 43*a* to 43*d*. Detection signals (measurement signals) for measuring strengths of the external magnetic fields in the sensitivity regions ARa to ARd are generated by the read circuit 10 based on outputs of the optical sensor pairs 43*a* to 43*d*, and therefore the FID is acquired. Fitting is performed by the read circuit 10 with respect to the waveform of each FID using the function V, and the frequency $a_1$ of each FID is acquired as the measurement value of the magnetic field Bm in the negative y axis direction in the sensitivity regions ARa to ARd.

Next, the bias magnetic field gradient correction coils 12 and 13 will be specifically described.

For example, in an environment having no magnetic shield, or the like, it may be difficult to form a uniform magnetic field due to an influence of an environmental magnetic field or the like even if the bias magnetic field By is uniformly applied through the bias magnetic field coil 11. Since the resonance frequency of alkali atoms deviates if the bias magnetic field By is not uniform, the relaxation time of the FID becomes short. As a result, the fitting accuracy becomes insufficient, and high sensitivity may not be expected. Hence, the optically pumped magnetometer 1 includes the bias magnetic field gradient correction coils (gradient correction coils) 12 and 13 for correcting the gradient of the bias magnetic field By caused by the bias magnetic field coil 11.

Figure 6:
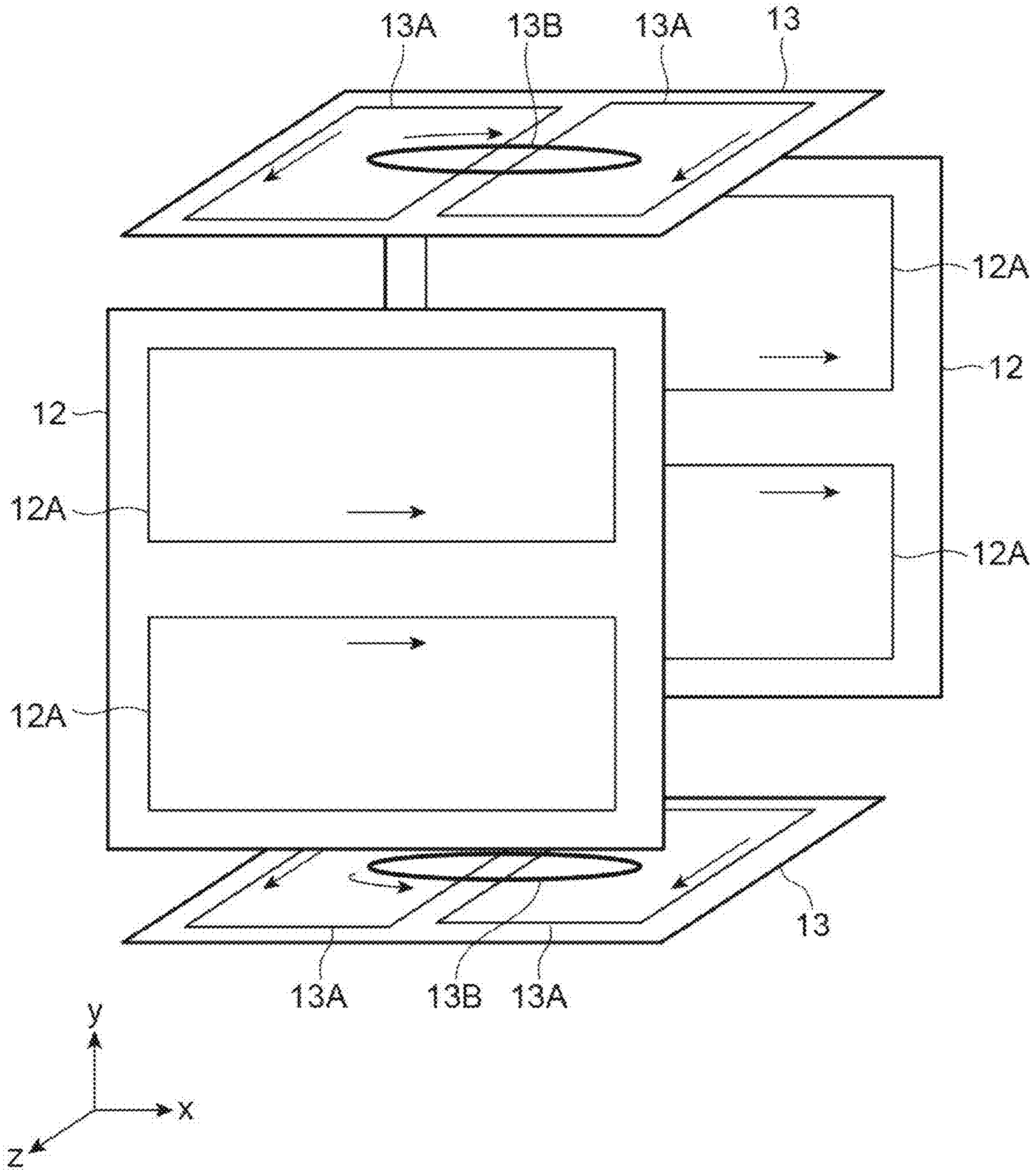
FIG. 6 is a perspective view illustrating bias magnetic field gradient correction coils in FIG. 1.
Figure 7B:
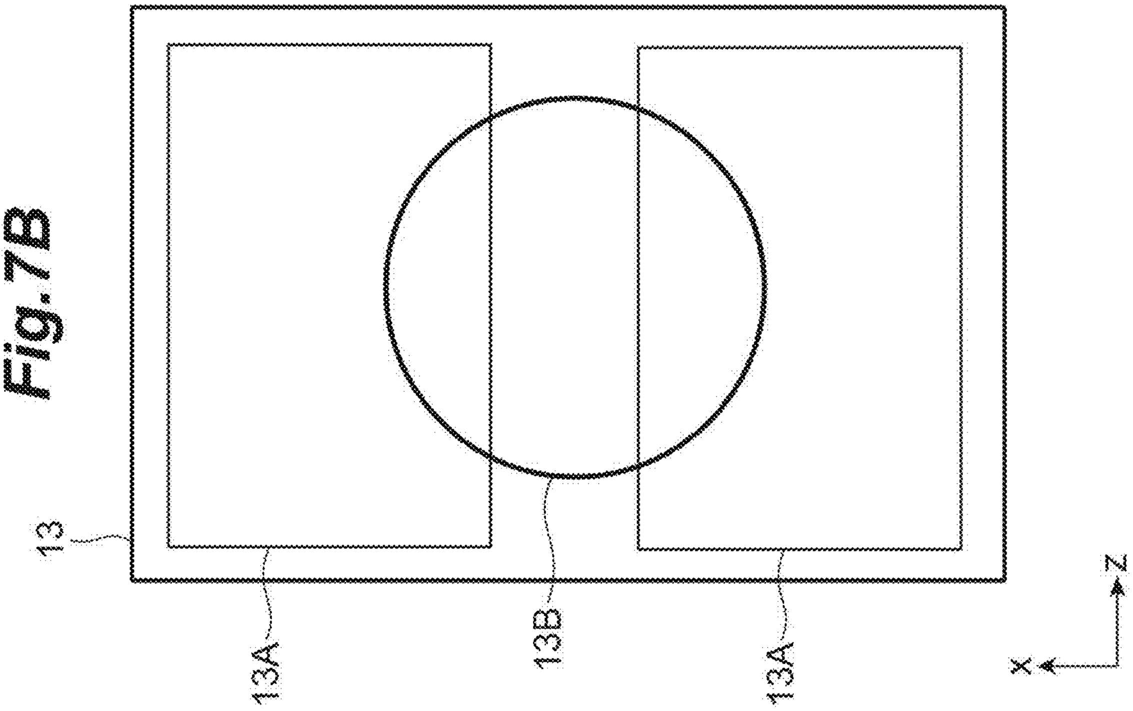
FIG. 7B is a plan view illustrating first coils and a third coil.
Figure 7A:
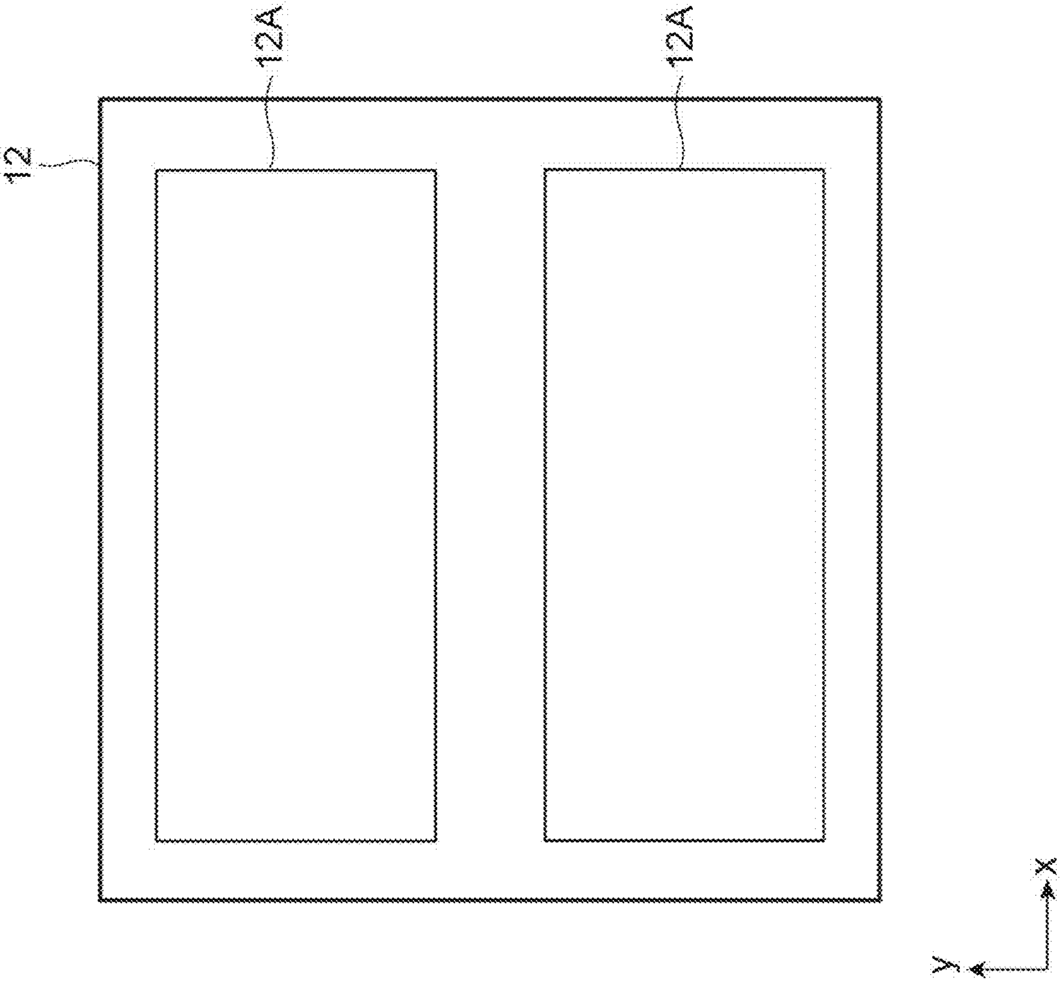
FIG. 7A is a plan view illustrating second coils.

As illustrated in FIGS. 1, 6, and 7A, the bias magnetic field gradient correction coil 12 is a coil having a parallel flat plate shape and includes second coils 12A. The second coils 12A are provided in each of a pair of substrates facing each other in the z axis direction with the cell 2 therebetween. The second coils 12A are disposed on one side and the other side of the cell 2 in the z axis direction. The second coils 12A correct the amount of change in the bias magnetic field By corresponding to the amount of change in position in the z axis direction. In the illustrated example, the second coils 12A are parallel four-wire coils.

As illustrated in FIGS. 1, 6, and 7B, the bias magnetic field gradient correction coil 13 is a coil having a parallel flat plate shape and includes first coils 13A and a third coil 13B. The first coils 13A and the third coil 13B are provided in each of a pair of substrates facing each other in the y axis direction with the cell 2 therebetween. The first coils 13A are disposed on one side and the other side of the cell 2 in the y axis direction. The first coils 13A correct the amount of change in the bias magnetic field By corresponding to the amount of change in position in the x axis direction. In the illustrated example, the first coils 13A are parallel four-wire coils. The third coil 13B is disposed on one side and the other side of the cell 2 in the y axis direction. The third coil 13B corrects the amount of change in the bias magnetic field By corresponding to the amount of change in position in the y axis direction. In the illustrated example, the third coil 13B is a maxwell coil.

The first to third coil 13A, 12A, and 13B are coils for correcting a primary gradient magnetic field. The first to third coil 13A, 12A, and 13B may be coils for further correcting a secondary gradient magnetic field. In this case, the uniformity of the bias magnetic field By can be further improved. The arrows indicated in the first to third coil 13A, 12A, and 13B in FIG. 6 indicate directions of applied currents.

Figure 8A:
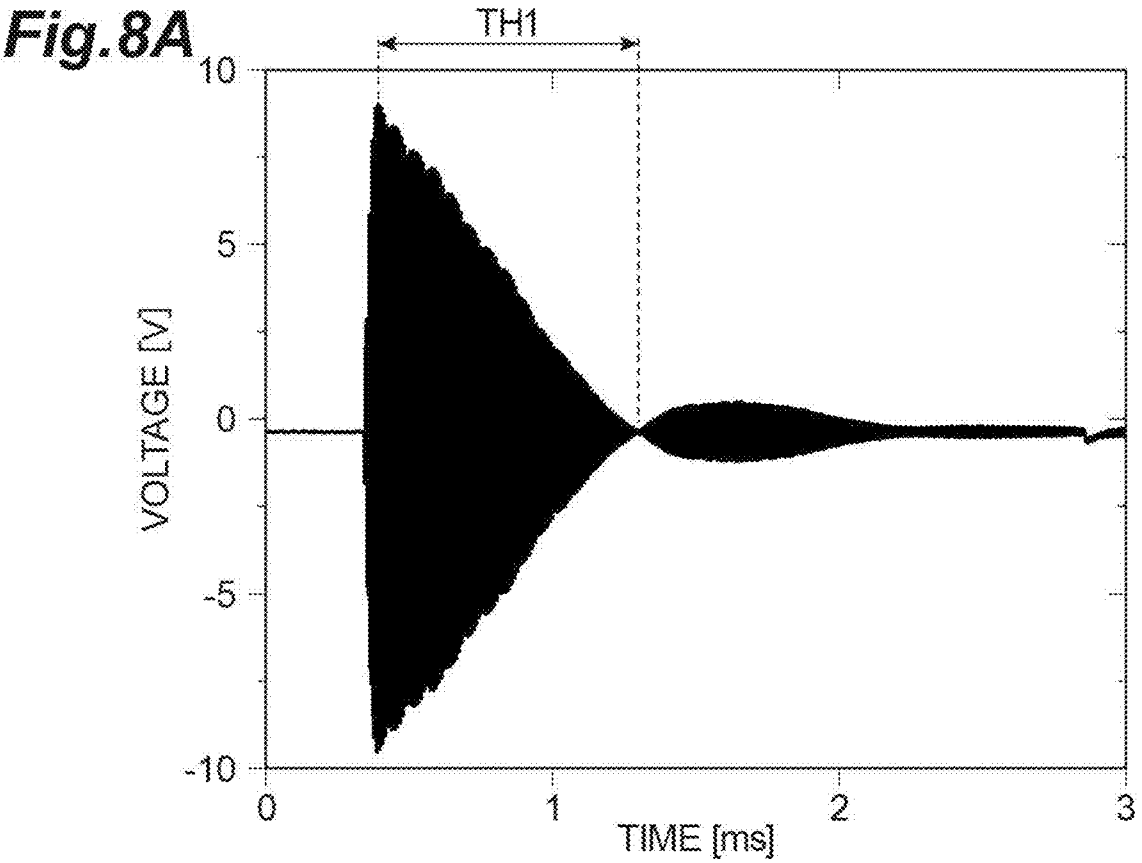
FIG. 8A is a graph showing change over time in FID for describing a correction procedure performed by the bias magnetic field gradient correction coils.
Figure 8B:
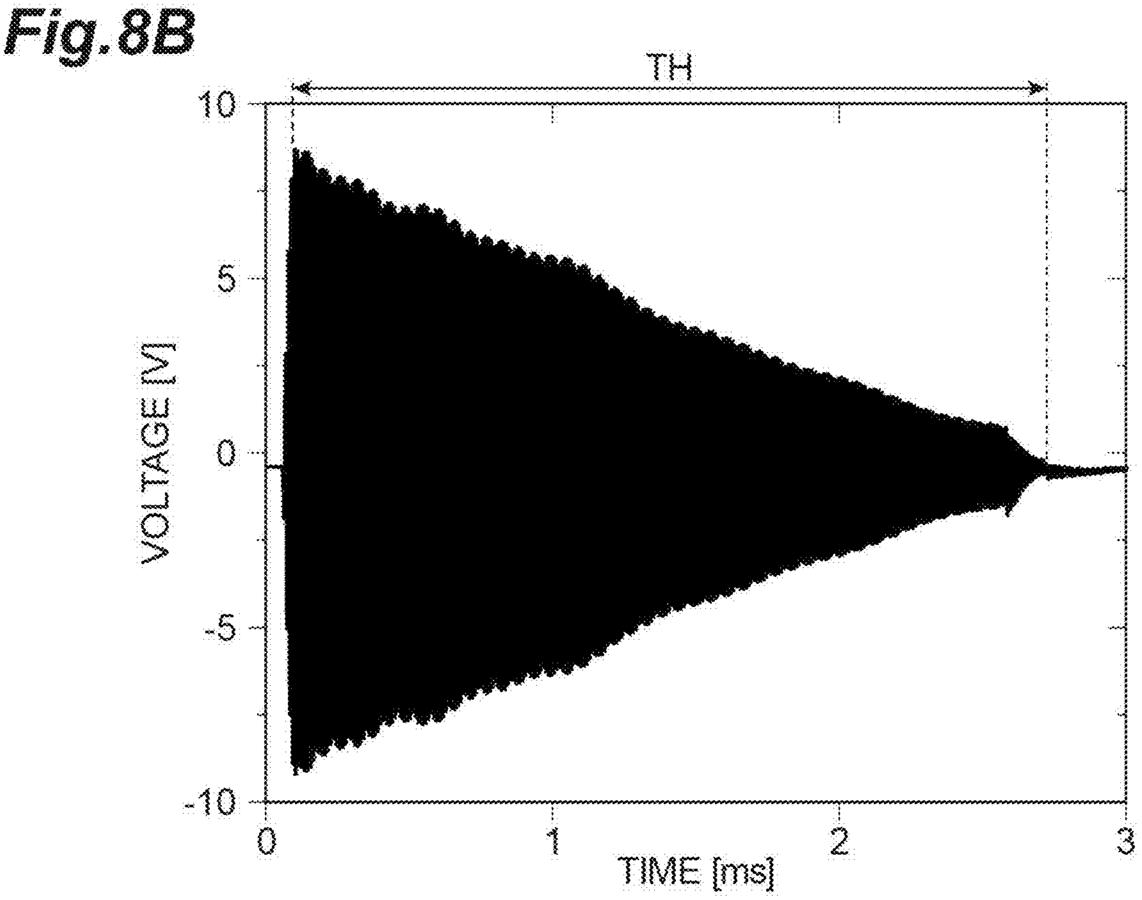
FIG. 8B is another graph showing change over time in FID for describing a correction procedure performed by the bias magnetic field gradient correction coils.

Such bias magnetic field gradient correction coils 12 and 13 correct the gradient of the bias magnetic field By such that a relaxation time TH of the FID (refer to FIG. 8B) becomes longer than a first time TH1 when correction by the bias magnetic field gradient correction coils 12 and 13 is not performed (refer to FIG. 8A). In the present embodiment, the bias magnetic field gradient correction coils 12 and 13 correct the gradient of the bias magnetic field By such that the relaxation time of the FID becomes the longest.

An example of a correction procedure in which the gradient of the bias magnetic field By is corrected by the bias magnetic field gradient correction coils 12 and 13 will be specifically described. First, in a state where there is no magnetic field Bm (measurement target), the FID is monitored. The FID can be monitored using an oscilloscope or the like. While a spectrum of the FID after fast Fourier transform (which will hereinafter be referred to as "an FFT spectrum") is observed, a current flowing in the bias magnetic field coil 11 is adjusted such that the peak position is at a desired frequency (for example, 100 kHz).

Subsequently, a current is applied to the first to third coil 13A, 12A, and 13B, and the current value thereof is adjusted such that the relaxation time TH of the FID becomes the longest. At this time, when the peak position deviates from a desired frequency in the FFT spectrum of the FID, a current flowing in the bias magnetic field coil 11 is adjusted again. This is repeated as necessary, and therefore correction of the gradient of the bias magnetic field By is completed.

Hereinabove, in the present embodiment, the uniformity of the bias magnetic field By can be enhanced by correcting the gradient of the bias magnetic field By through the bias magnetic field gradient correction coils 12 and 13, and unevenness in the resonance frequency of electron spins can be curbed. Accordingly, the sensitivity of a magnetic field strength can be enhanced.

In the present embodiment, the bias magnetic field gradient correction coil 13 includes the first coils 13A. In this case, the uniformity of the bias magnetic field By at the position in the x axis direction can be enhanced. In the present embodiment, the bias magnetic field gradient correction coil 12 includes the second coils 12A. In this case, the uniformity of the bias magnetic field By at the position in the z axis direction can be enhanced. In the present embodiment, the bias magnetic field gradient correction coil 13 includes the third coil 13B. In this case, the uniformity of the bias magnetic field By at the position in the y axis direction can be enhanced.

In the present embodiment, the bias magnetic field gradient correction coils 12 and 13 correct the gradient of the bias magnetic field By such that the relaxation time of the FID becomes longer than the first time TH1. In this case, the gradient of the bias magnetic field By can be effectively corrected.

In the present embodiment, the bias magnetic field gradient correction coils 12 and 13 correct the gradient of the bias magnetic field By such that the relaxation time of the FID becomes the longest. In this case, the gradient of the bias magnetic field By can be more effectively corrected.

The present embodiment is provided with the bias magnetic field coil 11 for applying the bias magnetic field By in the same direction as pump light and determining the resonance frequency of electron spins, and the tilting coil 14 for tilting the direction of electron spins in a direction perpendicular to pump light. In this case, the measurement sensitivity of an external magnetic field can be maintained without being influenced by an environmental magnetic field by measuring the strength of the external magnetic field on the basis of the frequency of change in polarization plane angle of probe light using detection signals.

In the present embodiment, the tilting coil 14 for radiating the RF signal having the same frequency as the resonance frequency is used. In this case, the rotation axis direction of electron spins can be tilted utilizing the RF signal. Using a simple means, measurement of an external magnetic field based on the frequency of change in polarization plane angle of probe light can be realized. In the present embodiment, a light source radiating pulsed light can also be used. In this case, the rotation axis direction of electron spins can be tilted utilizing pulsed light. Using a simple means, measurement of an external magnetic field based on the frequency of change in polarization plane angle of probe light can be realized.

The present embodiment has the sensitivity regions ARa to ARd divided into four in the z axis direction. For this reason, common mode noise can be removed by acquiring the difference value between the measurement values of the external magnetic fields acquired in two adjacent sensitivity regions of the four divided sensitivity regions ARa to ARd. Namely, in the present embodiment, there are two or more sensitivity regions, and the read circuit 10 can measure the magnetic field strength based on the difference between outputs of the optical sensors corresponding to the two adjacent sensitivity regions. In this case, common mode noise common to the two adjacent sensitivity regions is removed so that measurement of a weak magnetic field strength can be realized and the sensitivity of the magnetic field strength can be further enhanced. The effect of enhancing sensitivity is particularly noticeable when there is no magnetic shield. For example, the detection limit of 20 pT/rHz can be reduced to 300 ft/rHz or lower by approximately two orders of magnitude.

In the present embodiment, it is important to widen the sensitivity regions ARa to ARd in order to improve the sensitivity. In this respect, the inner diameter of the cell 2 is preferably 10×10 mm. At this time, it is preferable that the diameter of pump light be 10 mm and the diameter of probe light be 5 mm. In the orthogonal-type optically pumped magnetometer 1, when the four sensitivity regions ARa to ARd are provided at intervals of 10 mm, due to the size limitation of the polarization beam splitters 23*a*, 23*b*, and 23*c* for dividing pump light, it is desirable to form pump light into a substantially rectangular shape (for example, 10 mm×5 mm), increase the region intersecting probe light, and limit pump light in a direction orthogonal to it.

The optically pumped magnetometer 1 of the present embodiment constitutes a scalar magnetic sensor. The scalar magnetic sensor has a significant advantage of being able to measure a magnetic field without a magnetic shield, but there is a probability that the sensitivity will be likely to deteriorate if the bias magnetic field By has poor uniformity. According to the present embodiment, the uniformity of the bias magnetic field By can be improved, and the relaxation time of the FID can be lengthened. For example, high sensitivity of 300 fT/fHz or lower can be realized without a magnetic shield. By using a scalar magnetic sensor, the necessity of using an expensive magnetic shield can be reduced.

Hereinabove, various embodiments of the present invention have been described, but the present invention is not limited to the foregoing embodiments and may be modified or applied to other forms within a range not changing the gist described in each claim.

Figure 9:
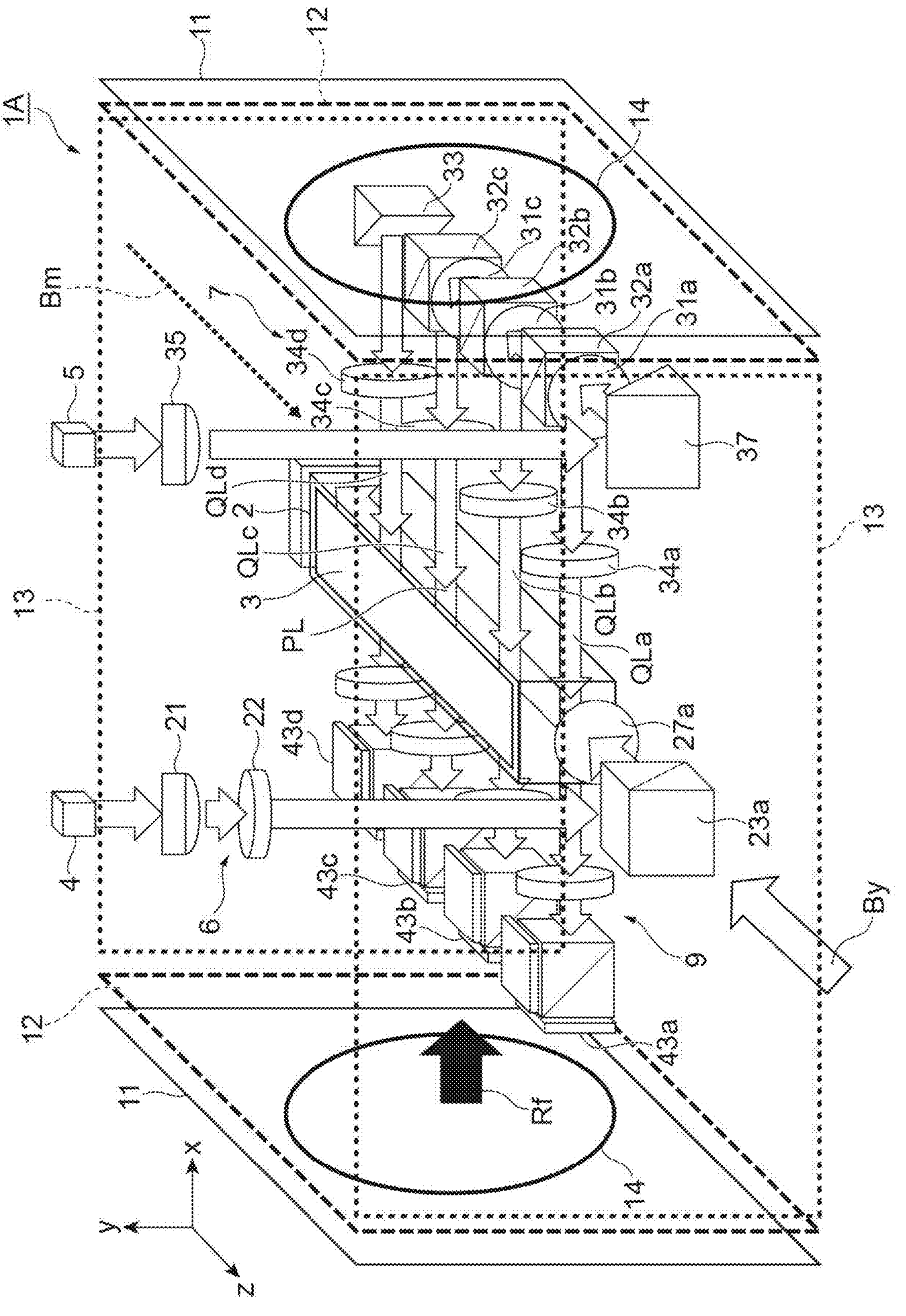
FIG. 9 is a perspective view illustrating a constitution of an optically pumped magnetometer according to a first modification example.

FIG. 9 is a perspective view illustrating a constitution of an optically pumped magnetometer 1A according to a first modification example. The optically pumped magnetometer 1A differs from the optically pumped magnetometer 1 in that the incidence direction of pump light to the cell 2 and the applying direction of the bias magnetic field By are set in the z axis direction, and the radiation direction of the RF signal Rf is set in the x axis direction. Hereinafter, only the constitutions different from those of the optically pumped magnetometer 1 will be described.

The first optical system 6 is constituted to include the lens 21, the ½ wavelength plate 22, the polarization beam splitter 23*a*, and the ¼ wavelength plate 27*a*. The polarization beam splitter 23*a* is provided adjacent to the ½ wavelength plate 22 in the negative y axis direction and reflects the component of linear polarized light of pump light which has been transmitted through the ½ wavelength plate in the negative z axis direction. The ¼ wavelength plate 27*a* is provided adjacent to the polarization beam splitter 23*a* in the negative z direction, changes pump light (linear polarized light) to circularly polarized light reflected by the polarization beam splitter 23*a*, and causes the pump light to be transmitted therethrough in the negative z axis direction. The first optical system 6 having the foregoing constitution is constituted such that pump light of one system can be incident in the longitudinal direction (z axis direction) inside the cell 2.

In addition to the ½ wavelength plates 31*a*, 31*b*, and 31*c*, the polarization beam splitters 32*a*, 32*b*, and 32*c*, the total reflection mirror 33, and the polarizers 34*a*, 34*b*, 34*c*, and 34*d*, the second optical system 7 is constituted to include a lens 35, a ½ wavelength plate 36, and a total reflection mirror 37. The lens 35 is provided adjacent to the probe laser 5 in the negative y axis direction and condenses probe light emitted from the probe laser 5 in the negative y axis direction. The total reflection mirror 37 is provided adjacent to the ½ wavelength plate 36 in the negative y axis direction and reflects probe light which has been transmitted through the ½ wavelength plate 36 in the negative z axis direction toward the ½ wavelength plate 31*a*. The second optical system 7 having such a constitution is constituted such that rays of the probe light QLa to QLd of four systems transmitted through the four polarizers 34*a*, 34*b*, 34*c*, and 34*d* can be respectively incident on the four sensitivity regions arranged in the longitudinal direction inside the cell 2 and intersecting the pump light PL.

According to the axis-type optically pumped magnetometer 1A according to the foregoing the first modification example, regarding the four sensitivity regions divided in the z axis direction, the measurement value of the magnetic field Bm in the z axis direction that is the incidence direction of pump light can be acquired. The optically pumped magnetometer 1A also exhibits the foregoing operational effect of being able to enhance the sensitivity of the magnetic field strength. The optically pumped magnetometer 1A has four sensitivity regions but may be changed to a constitution having two sensitivity regions. In such a case as well, common mode noise can be removed and detection accuracy can be enhanced by acquiring the difference between the measurement values in the two sensitivity regions. One, three, five, or more sensitivity regions may be provided.

Figure 10:
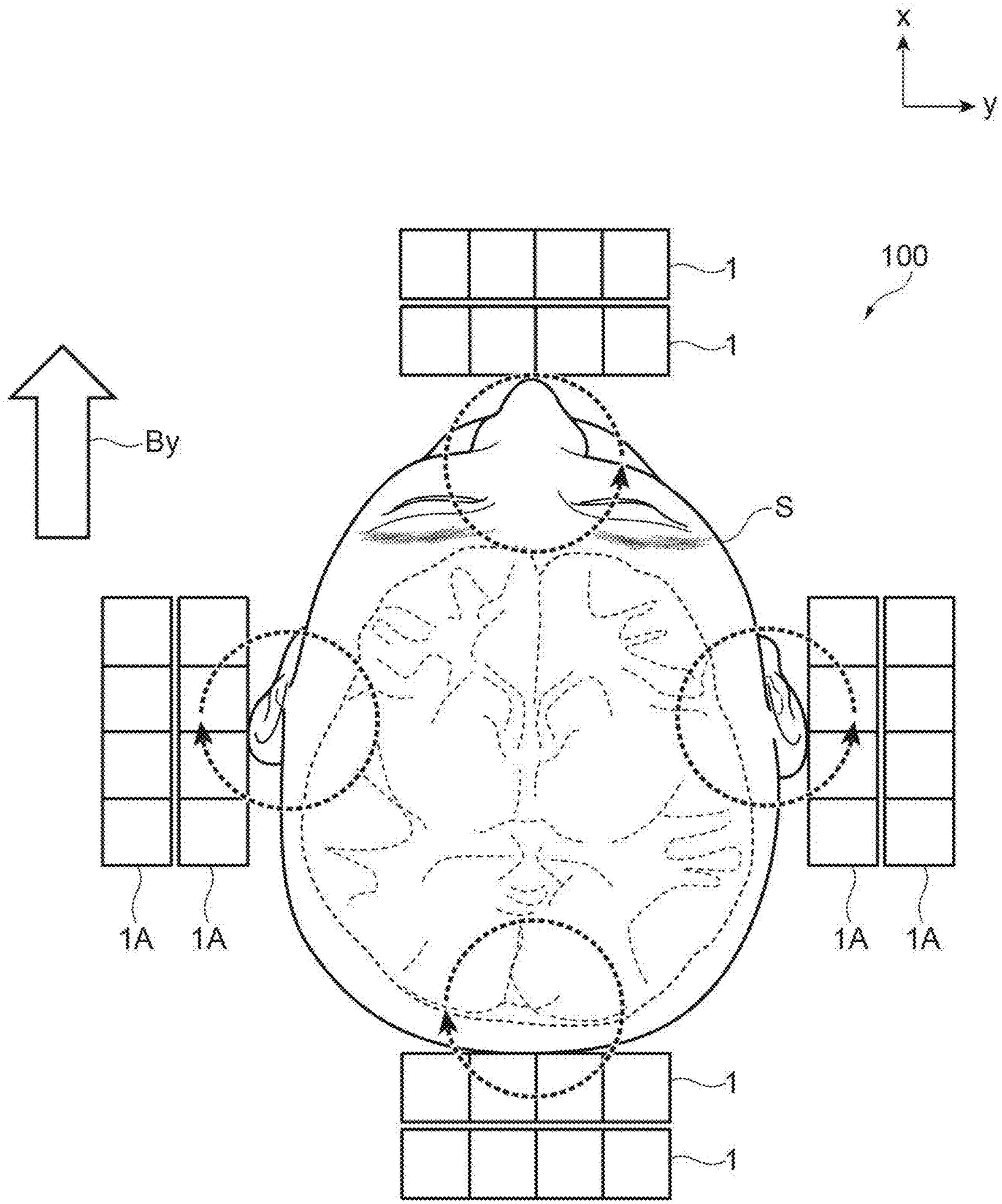
FIG. 10 is a plan view illustrating a constitution of a magnetoencephalograph according to another embodiment.

FIG. 10 is a plan view illustrating a constitution of a magnetoencephalograph 100 according to another embodiment. The magnetoencephalograph 100 includes a plurality of optically pumped magnetometers 1 and a plurality of optically pumped magnetometers 1A provided in a manner of being able to be disposed around a head (test object) S of a test subject. In each of two optically pumped magnetometers 1 of the plurality of optically pumped magnetometers 1, four sensitivity regions are disposed side by side in parallel in a predetermined direction (y axis direction) at closer positions and at separated positions with respect to the head S. In each of two optically pumped magnetometers 1A of the plurality of optically pumped magnetometers 1A as well, four sensitivity regions are disposed side by side in parallel in a direction (x axis direction) substantially perpendicular to the array direction of the sensitivity regions in the optically pumped magnetometer 1 at closer positions and at separated positions with respect to the head S. In addition, the bias magnetic field coil 11, the bias magnetic field gradient correction coils 12 and 13, and the tilting coil 14 are shared between the plurality of optically pumped magnetometers 1 and the plurality of optically pumped magnetometers 1A. The bias magnetic field By is applied in the x axis direction through the bias magnetic field coil 11. The optically pumped magnetometers 1 and 1A measure strengths of magnetic fields emitted from the head S.

According to the magnetoencephalograph 100 having the foregoing constitution, measurement values of measured weak magnetic fields from the head S can be acquired. Specifically, according to the disposition example of FIG. 10, measurement values of magnetic fields in the sensitivity regions (8×4=32) in the x axis direction can be acquired. In addition, weak magnetoencephalography having common mode noise removed therefrom can be measured by acquiring a difference between the measurement values of the sensitivity regions closer to the head S and the measurement values of the sensitivity regions adjacent to the sensitivity regions on the outward side of the head S.

The magnetoencephalograph 100 can also be applied to a constitution in which the optically pumped magnetometer 1 and the optically pumped magnetometer 1A are disposed only at positions closer to the head S and are not disposed in parallel. In this case, weak magnetoencephalography having common mode noise removed therefrom can be measured by acquiring a difference between the measurement values of two adjacent sensitivity regions of one optically pumped magnetometer 1 and one optically pumped magnetometer 1A. Since the magnetoencephalograph 100 also includes the optically pumped magnetometers 1 and 1A, the foregoing operational effect of being able to enhance the sensitivity of the magnetic field strength is exhibited.

Figure 11B:
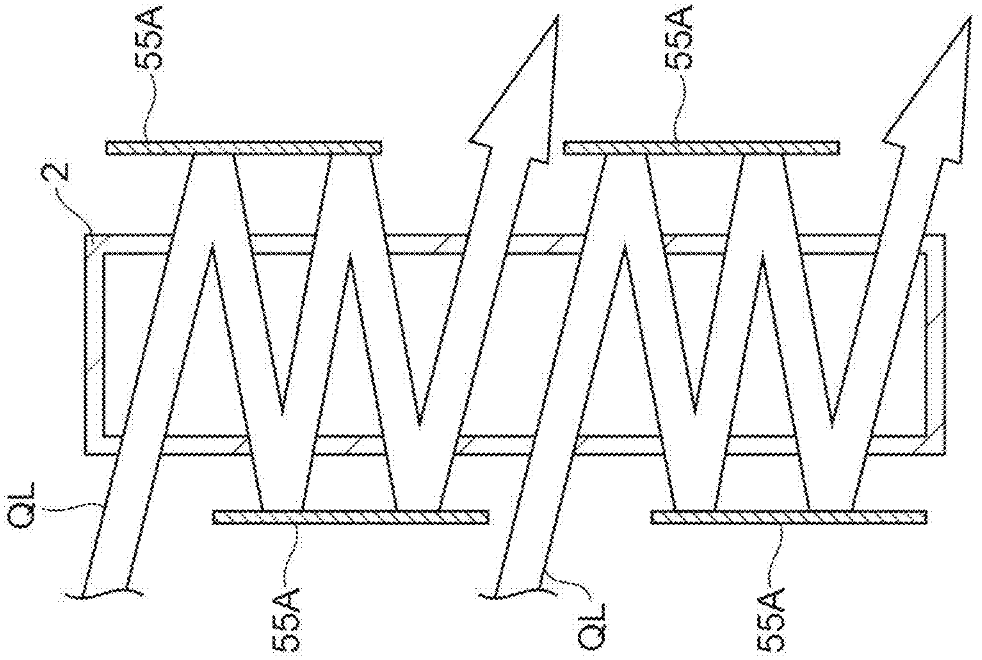
FIG. 11B is a cross-sectional view schematically illustrating the cell according to another modification example provided with mirrors.
Figure 11A:
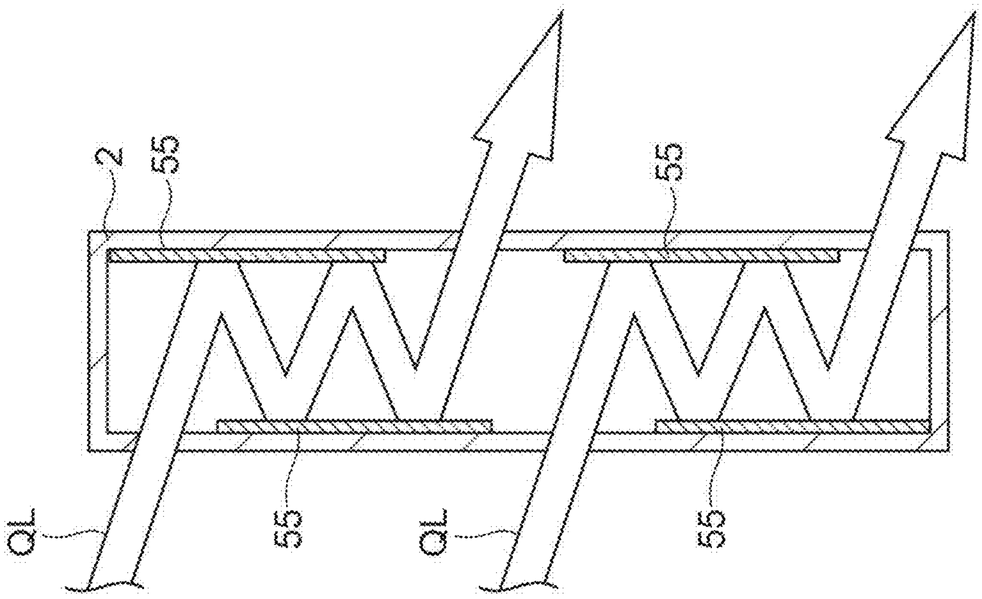
FIG. 11A is a cross-sectional view schematically illustrating a cell according to a modification example provided with mirrors.

As illustrated in FIG. 11A, the optically pumped magnetometers 1 and 1A of the foregoing embodiments may include mirrors 55 reflecting probe light traveling inside the cell 2 toward the outside of the cell 2. The mirrors 55 may be metal films such as aluminum vapor-deposited in an inner wall of the cell 2 or may be dielectric multilayer film mirrors. The mirrors 55 may be provided in an outer wall of the cell 2. Alternatively, as illustrated in FIG. 11B, the optically pumped magnetometers 1 and 1A of the foregoing embodiments may include one or a plurality of mirrors 55A reflecting probe light QL having traveled from the inside of the cell 2 to the outside of the cell 2 such that the probe light QL returns to the inside of the cell 2. The mirrors 55A are installed outside the cell 2. In this manner, the optical path length of the probe light QL inside the cell 2 can be increased by reflecting the probe light QL a plurality of times using the mirrors 55 and 55A so that the rotation angle (Faraday rotation angle) of the polarization plane of the probe light QL increases and the response of the read circuit 10 increases. As a result, for example, the level of noise caused by the probe light QL and the read circuit 10 can be relatively reduced.

In the foregoing embodiments, the bias magnetic field gradient correction coils 12 and 13 may correct the gradient of the bias magnetic field By such that an FFT spectral peak regarding the relaxation time of the FID becomes steeper than when correction by the bias magnetic field gradient correction coils 12 and 13 is not performed. In this case, the gradient of the bias magnetic field By can be effectively corrected. In addition, in the foregoing embodiments, the bias magnetic field gradient correction coils 12 and 13 may correct the gradient of the bias magnetic field By such that the FFT spectral peak regarding the relaxation time of the FID becomes the steepest. In this case, the gradient of the bias magnetic field By can be more effectively corrected. In the foregoing embodiments, there have been cases where light of linear polarized light is used by being converted into light of circularly polarized light, but light of circularly polarized light may be used from the beginning without performing the conversion.

According to the present disclosure, it is possible to provide an optically pumped magnetometer and a magnetoencephalograph capable of enhancing a sensitivity of a magnetic field strength.

What is claimed is:

1. An optically pumped magnetometer comprising:

a cell configured to be filled with alkali metal vapor;

a pump light incidence unit configured to cause pump light for pumping alkali metal atoms constituting the alkali metal vapor to be incident on a sensitivity region inside the cell in a first direction;

a probe light incidence unit configured to cause probe light for detecting change in electron spins in a pumped state of the alkali metal atoms to be incident on the sensitivity region in a direction intersecting the first direction;

a bias magnetic field coil configured to apply a bias magnetic field in the first direction to the inside of the cell and determine a resonance frequency of the electron spins;

a gradient correction coil configured to correct a gradient of the bias magnetic field applied through the bias magnetic field coil;

an electron spin tilting unit configured to tilt a rotation axis direction of the electron spins in a direction perpendicular to the first direction;

an optical sensor configured to detect the probe light having passed through the sensitivity region; and a magnetic field measuring unit configured to measure a magnetic field strength related to the sensitivity region based on an output of the optical sensor, wherein the gradient correction coil includes a pair of first coils disposed on one side and the other side of the cell in the first direction and correcting an amount of change in the bias magnetic field with respect to an amount of change in position in the first direction, and a pair of second coils disposed on one side and the other side of the cell in a second direction perpendicular to the first direction and correcting an amount of change in the bias magnetic field with respect to an amount of change in position in the second direction.

2. The optically pumped magnetometer according to claim 1, wherein the gradient correction coil includes a pair of third coils disposed on one side and the other side of the cell in the first direction and correcting an amount of change in the bias magnetic field with respect to an amount of change in position in a third direction perpendicular to the first direction.

3. The optically pumped magnetometer according to claim 1 further comprising:

one or a plurality of mirrors configured to reflect the probe light traveling inside the cell toward the outside of the cell or having traveled from the inside of the cell to the outside of the cell such that the probe light returns to the inside of the cell.

4. The optically pumped magnetometer according to claim 1, wherein the electron spin tilting unit radiates an RF signal having the same frequency as the resonance frequency.

5. The optically pumped magnetometer according to claim 1, wherein the electron spin tilting unit radiates pulsed light.

6. The optically pumped magnetometer according to claim 1, wherein there are two or more of the sensitivity regions, and the magnetic field measuring unit measures the magnetic field strength based on a difference between outputs of the optical sensor corresponding to the two adjacent sensitivity regions.

7. A magnetoencephalograph comprising:

the optically pumped magnetometer according to claim 1 configured to be provided in a manner of being able to be disposed around the head of a test object and measure a strength of a magnetic field emitted from the test object.

8. An optically pumped magnetometer comprising:

a cell configured to be filled with alkali metal vapor;

a pump light incidence unit configured to cause pump light for pumping alkali metal atoms constituting the alkali metal vapor to be incident on a sensitivity region inside the cell in a first direction;

a probe light incidence unit configured to cause probe light for detecting change in electron spins in a pumped state of the alkali metal atoms to be incident on the sensitivity region in a direction intersecting the first direction;

a bias magnetic field coil configured to apply a bias magnetic field in the first direction to the inside of the cell and determine a resonance frequency of the electron spins;

a gradient correction coil configured to correct a gradient of the bias magnetic field applied through the bias magnetic field coil;

an electron spin tilting unit configured to tilt a rotation axis direction of the electron spins in a direction perpendicular to the first direction;

an optical sensor configured to detect the probe light having passed through the sensitivity region; and a magnetic field measuring unit configured to measure a magnetic field strength related to the sensitivity region based on an output of the optical sensor, wherein the gradient correction coil corrects the gradient of the bias magnetic field such that a relaxation time of free induction decay obtained from an output of the optical sensor becomes longer than a first time when correction by the gradient correction coil is not performed, and wherein the gradient correction coil corrects the gradient of the bias magnetic field such that the relaxation time of free induction decay obtained from an output of the optical sensor becomes the longest.

9. An optically pumped magnetometer comprising:

a cell configured to be filled with alkali metal vapor;

a pump light incidence unit configured to cause pump light for pumping alkali metal atoms constituting the alkali metal vapor to be incident on a sensitivity region inside the cell in a first direction;

a probe light incidence unit configured to cause probe light for detecting change in electron spins in a pumped state of the alkali metal atoms to be incident on the sensitivity region in a direction intersecting the first direction;

a bias magnetic field coil configured to apply a bias magnetic field in the first direction to the inside of the cell and determine a resonance frequency of the electron spins;

a gradient correction coil configured to correct a gradient of the bias magnetic field applied through the bias magnetic field coil;

an electron spin tilting unit configured to tilt a rotation axis direction of the electron spins in a direction perpendicular to the first direction;

an optical sensor configured to detect the probe light having passed through the sensitivity region; and a magnetic field measuring unit configured to measure a magnetic field strength related to the sensitivity region based on an output of the optical sensor, wherein the gradient correction coil corrects the gradient of the bias magnetic field such that a spectral peak after fast Fourier transform regarding a relaxation time of free induction decay obtained from an output of the optical sensor becomes steeper than when correction by the gradient correction coil is not performed, and wherein the gradient correction coil corrects the gradient of the bias magnetic field such that the spectral peak after fast Fourier transform regarding the relaxation time of free induction decay obtained from an output of the optical sensor becomes the steepest.

* * * * *